(12) United States Patent
Shattil

(10) Patent No.: US 7,092,352 B2
(45) Date of Patent: Aug. 15, 2006

(54) CANCELLATION SYSTEMS FOR MULTICARRIER TRANSCEIVER ARRAYS

(75) Inventor: Steve J. Shattil, Boulder, CO (US)

(73) Assignee: Aquity, LLC, San Diego, CA (US)

( * ) Notice: Subject to any disclaimer, the term of this patent is extended or adjusted under 35 U.S.C. 154(b) by 933 days.

(21) Appl. No.: 10/078,774

(22) Filed: Feb. 19, 2002

(65) Prior Publication Data

US 2004/0012387 A1    Jan. 22, 2004

Related U.S. Application Data

(60) Continuation-in-part of application No. 09/821,547, filed on Mar. 29, 2001, now Pat. No. 6,348,791, which is a division of application No. 09/433,196, filed on Nov. 3, 1999, now Pat. No. 6,211,671, which is a division of application No. 08/279,050, filed on Jul. 22, 1994, now Pat. No. 6,208,135, which is a continuation-in-part of application No. 08/097,272, filed on Jul. 23, 1993, now Pat. No. 5,523,526.

(51) Int. Cl.
*H04J 11/00*    (2006.01)

(52) U.S. Cl. ...................... 370/210; 370/225
(58) Field of Classification Search ............. None
See application file for complete search history.

(56) References Cited

U.S. PATENT DOCUMENTS 6,538,436 B1 * 3/2003 Simola et al. ............ 324/248

2001/0019264 A1 * 9/2001 Shattil ........................ 324/225
2002/0191535 A1 * 12/2002 Sugiyama et al. ........... 370/208
2004/0213146 A1 * 10/2004 Jones et al. ................. 370/210

OTHER PUBLICATIONS

J.H. Park, Jr., "Optimum Signal Processing For Adaptive Arrays with Broadband Signals and Interferers", National Telecom. Conf., Nov.-Dec. 1985, vol. 2, pp. C7.6.1-C7.6.5.
J.H. Winters, "On the Capacity of radio communication systems with diversity in a rayleigh fading environment," IEEE J. Sel. Areas Comm., vol. SAC-2, pp. 871-878, Jun. 1987.

(Continued)

*Primary Examiner*—Duc Ho

(57) ABSTRACT

Frequency-dependent cancellation separates a plurality of interfering signals received by a plurality of receivers. Received wideband single-carrier signals or multicarrier signals are separated into a plurality of narrowband subcarriers. Sub-carrier frequencies and frequency-band characteristics may be selected with respect to channel characteristics (e.g., coherence bandwidth, interference, etc.). A cancellation circuit provides complex weights to the sub-carrier components. Weighted components associated with each sub-carrier frequency are combined to separate a plurality of interfering signals. Optionally, a plurality of the separated subcarriers may be combined to reconstruct at least one transmitted single-carrier signal from a plurality of frequency components. Combining may include decoding, such as to reconstruct a coded sequence of data symbols transmitted via direct-sequence coding, code division multiple access (CDMA), multicarrier CDMA, carrier interferometry (CI), CI coding, or coded orthogonal frequency division multiplexing.

24 Claims, 8 Drawing Sheets

OTHER PUBLICATIONS

P. Balaban, "Dual diversity combining and equalization in digital cellular mobile radio," Vehicular Technology, IEEE Transactions on vol. 40, Issue 2, May 1991, pp. 342-354.

R.D. Gitlin et al., "The Capacity of Wireless Communication Systems Can Be Substantially Increased By The Use of Antenna Diversity", Proc. First International Conference on Universal Personal Communications, Sep. 29-Oct. 2, 1992, Dallas, Tx, pp. 28-32.

P. Balaban et al., "Optimum diversity combining and equalization in data transmission with application to cellular mobile radio—Part I: Theoretical considerations," IEEE Trans. Commun., vol. 40, pp. 885-894, May 1992.

J.G.Proakis, "Adaptive equalization for TDMA digital mobile radio," IEEE Trans. Veh. Technol., vol. 40, pp. 333-341, May 1991.

A.Wittneben, "A new bandwidth efficient transmit antenna modulation diversity scheme for linear digital modulation," in Proc. IEEE ICC'93 Geneva, Switzerland, vol. 3, 1993, pp. 1630-1634.

V.Weerackody, "Diversity for the direct-sequence spread spectrum system using multiple transmit antennas," in Proc. ICC'93 Geneva, Switzerland, vol. III, May 1993, pp. 1503-1506.

J. Yang et al., "A digital Rayleigh fade compensation technology for coherent OQPSK system," in Proc. IEEE VTC'90 Orlando, FL, May 1990, pp. 732-737.

A. Aghamohammadi, et al., "A new method for phase synchronization and automatic gain control of linearly modulated signals on frequency-flat fading channel," IEEE Trans. Commun., vol. 39, pp. 25-29, Jan. 1991.

N. Jablon, "Adaptive beamforming with the generalized sidelobe canceller in the presence of array imperfections," Antennas and Propagation, IEEE Transactions on vol. 34, Issue 8, Aug. 1986 pp. 996-1012.

R.S. Cheng, et al., "Capacity of root-mean-square bandlimited Gaussian multiuser channels," Information Theory, IEEE Transactions on vol. 37, Issue 3, Part: 2, May 1991, pp. 453-465.

R.S. Cheng, et al., "Gaussian multiaccess channels with ISI: capacity region and multiuser water-filling," Information Theory, IEEE Transactions on vol. 39, Issue 3, May 1993, pp. 773-785.

J.H.Winters, et al., "Adaptive Antennas for Digital Mobile radio," Adaptive Antenna Systems Symposium, 1992, Proceedings of the IEEE Long Island Section, Nov. 1992, pp. 81-86.

J. Salz, et al., "Effect of fading correlation on adaptive arrays in digital wireless communications," Communications, 1993. ICC 93. Geneva. Technical Program, Conference Record, IEEE International Conference, vol. 3, May 23-26, 1993, pp. 1768-1774.

A. Dembo et al., "On the least squares tap adjustment algorithm in adaptive digital echo cancellers," Communications, IEEE Transactions on vol. 38, Issue 5, May 1990, pp. 622-628.

J.H. Winters, "Optimum Combining in Digital Mobile Radio with Cochannel Interference," IEEE Journ.-Selected Areas in Comm., vol. Sac-2, No. 4, Jul. 1984, pp. 528-539.

J.Winters, "Optimum Combining for Indoor Radio Systems with Multiple Users," Communications, IEEE Transactions on vol. 35, Issue 11, Nov. 1987, pp. 1222-1230.

L.J. Cimini, Jr., "Analysis and simulation of a digital mobile channel using orthogonal frequency division multiplexing," 1985, IEEE, vol. 33, No. 7, pp. 665-675.

G. Forney, "Maximum-likelihood sequence estimation of digital sequences in the presence of intersymbol interference," 1972, IEEE Trans. Inform. Theory, vol. IT-18(3), pp. 363-378.

A. Duel-Hallen, "Equalizers for multiple input multiple output channels and PAM systems with cyclostationary input sequences," 1992, IEEE Journal of Sel. Areas in Comm., vol. 10(3), pp. 630-639.

* cited by examiner

US 7,092,352 B2

CANCELLATION SYSTEMS FOR MULTICARRIER TRANSCEIVER ARRAYS

RELATED APPLICATIONS

This application is a continuation-in-part of Ser. No. 09/821,547, filed Mar. 29, 2001, now U.S. Pat. No. 6,348, 791, which is a division of Ser. No. 09/433,196, filed Nov. 3, 1999, now U.S. Pat. No. 6,211,671, which is a division of Ser. No. 08/279,050, filed Jul. 22, 1994, now U.S. Pat. No. 6,208,135, which is a continuation-in-part of application Ser. No. 08/097,272, filed Jul. 23, 1993, now U.S. Pat. No. 5,523,526.

BACKGROUND OF THE INVENTION

I. Field of the Invention

The present invention relates to applications of active electromagnetic shielding to electromagnetic receivers for canceling undesired, interfering signals.

II. Description of the Related Art

It has long been known that voltages are induced in all conductors exposed to changing magnetic fields regardless of the configuration of such conductors. Electromagnetic radiation will induce electrical signals in electronic devices according to the laws of magnetic induction. Thus, it has been desirable in some applications of electronic instrumentation to reduce the inductive noise caused by electromagnetic radiation.

A prior-art method for electronically shielding an electromagnetic pickup from an electromagnetic source is to "unbalance" either the pickup device or the electromagnetic source. Such a method is described by Hoover in U.S. Pat. No. 4,941,388. Hoover provides amplitude adjustment to compensate for amplitude variations between the responses of separate pickups to electromagnetic radiation. However, Hoover does not compensate for differences in the pickup coils that cause the amplitude-variation of the pick-up responses to be frequency-dependent. Thus, Hoover's proposed solution results in poor cancellation over a broad range of frequency. Furthermore, Hoover does not compensate for phase-variations that occur between different pickup coils. The resulting cancellation from the unbalancing method is poor.

Hoover describes the operation of negative feedback in an electrically coupled transceiver. An electromagnetic pickup provides an electrical signal to a drive coil that generates an electromagnetic field to which the pickup responds. Hoover mentions that the system tends to drift from the negative feedback condition at higher frequencies, and identifies the cause of this drift as distortions in the phase-response of the system resulting from the pickup, driver, and amplifier in the system. Hoover does not present an effective method for controlling the phase-response of the system, nor does Hoover present the mathematical relationships between phase and frequency resulting from the driver and pickup coils. Rather, Hoover proposes the use of a low-pass filter to reduce the gain of the system at which the negative feedback condition breaks down.

In U.S. Pat. No. 4,901,015, Pospischil shows a cancellation circuit for canceling the response of a pickup to ambient electromagnetic fields. Pospischil describes first and second pickups that are positioned in parallel with the wave fronts of an interfering electromagnetic field. With such placement, the electromagnetic field impinges simultaneously upon the first and second pickups. The pickups are connected in opposition. Thus, simultaneous impingement of the electromagnetic field upon the pickups is expected to produce a 180-degree phase displacement of the received signals.

If the electrical path lengths of the received signals in Pospischil's cancellation system are different where they are combined (summed), the relative phase difference between the received signals do not have 180-degree phase displacement. Thus, the signals do not completely cancel. In some cases, the signals combine constructively. Pospischil shows that differences in the electrical path length occur when the propagation path lengths of the signals received by the pickups are different (e.g., the signals do not impinge upon the pickups simultaneously). These differences in propagation path lengths can result from reflections, multipath delay, superpositions of multiple received signal components, or received electromagnetic signals having non-perpendicular angles of arrival.

Pospischil does not identify nor compensate for electrical path-length differences (e.g., differences in impedance) that occur between different electromagnetic receivers (pickups). Such pickup assemblies are also used with electric guitars and are known as "hum-bucking" pickups. This technique is not effective for providing a high degree of cancellation because slight differences between the pickups, even pickups that are substantially identical, cause the frequency-dependent amplitude and phase response of the pickups to differ significantly from each other. Thus, the pick-up signals will not be exactly out of phase and equal in amplitude when they are combined.

Coils of wire whose currents support magnetic fields in space function as antennas radiating electromagnetic energy. There are several cancellation methods used with antennas that act as electromagnetic shielding. One of these methods is the basis of operation for a side-lobe canceller that uses an auxiliary antenna in addition to a main antenna. Combining the outputs from the two antennas results in cancellation of the antenna beam pattern in the direction of a noise source so that the effective gain of the antenna in that direction is very small.

Similarly, beam forming in phased arrays provides directional interference cancellation. Beam forming can provide exceptional performance in a fading environment, which is due to the ability of an array to select signals based on the signals directions of arrival. As strong signals are selected for reception, destructive cancellation caused by reflected components arriving at the array elements is mitigated by the placement of nulls. Null placement is also effective in mitigating co-channel interference. However, problems with beam forming include the inability to resolve co-located or closely spaced radio sources unless multipath components of these signals are tracked. In addition, the number of antenna elements limits the number of co-channel interference sources that can be nulled. This is a significant problem because each multipath component arriving at the array is a source of interference. Therefore, a small number of transmitters may provide a large number of interference sources.

SUMMARY OF THE INVENTION

A frequency-dependent cancellation circuit is provided to a plurality of receivers. A filter bank coupled to each receiver decomposes received single-carrier or multicarrier signals into a plurality of narrowband subcarriers. In one aspect of the invention, the sub-carrier frequencies include overlapping orthogonal frequencies. The sub-carrier frequencies and frequency-band characteristics may be selected according to channel characteristics (e.g., coherence bandwidth, frequency-dependent fades, other distortions, interference, etc.).

The cancellation circuit provides complex weights to the sub-carrier components. Weighted components associated with each sub-carrier frequency are combined to separate at least one sub-carrier symbol from a plurality of interfering sub-carrier signals. A plurality of separated different-frequency subcarriers may be combined, such as to reconstruct one or more transmitted single-carrier signals from a plurality of frequency components. Combining may include decoding. Decoding may be provided to reconstruct a sequence of data symbols encoded via one or more coding techniques, including, but not limited to, direct-sequence coding, code division multiple access (CDMA), multicarrier CDMA, carrier interferometry (CI), CI coding, coded orthogonal frequency division multiplexing (OFDM), convolutional coding, trellis coding, block coding, turbo coding, etc.

Various techniques may be employed to select and/or adapt the complex weights, including deterministic and/or blind-adaptive techniques. Weights may be adapted to optimize some signal-quality measurement, such as signal-to-noise ratio, signal-to-interference ratio, signal-to-noise-plus-interference ratio, bit-error rate, probability of error, etc. Weights may be selected and/or adjusted with respect to one or more optimal-combining techniques, such as minimum-mean-squared-error combining (MMSEC), maximum-likelihood combining (MLC), equal-gain combining (EGC), or some combination thereof.

A cancellation circuit may be provided to a transmitter array. For example, a cancellation circuit may be coupled to a filter bank to provide complex weights to a plurality of transmitted frequency-domain components. The weights may be selected to produce one or more predetermined combining characteristics to the transmitted signals in at least one predetermined spatial location. For example, it may be desirable to produce constructive and/or destructive interference at some predetermined location. The weights may be adapted via feedback from one or more remote transceivers. Both transmitters and receivers may be provided with cancellation circuits. A cancellation circuit may be adapted to perform cancellation for both transmission and reception.

Some of the many wireless applications of the invention include local-area networks, cellular communications, personal communication systems, broadband wireless services, data-link services, air-to-air communications, air/ground communications, voice radio, satellite links, tagging and identification, wireless optical links, campus-area communications, wide-area networks, last-mile communication links, and broadcast systems. Embodiments of the invention may be used in non-wireless communication systems, such as guided wave, cable, wire, twisted pair, and/or optical fiber.

Embodiments of the invention may employ cancellation circuits in either or both transmitter arrays and receiver arrays to improve bandwidth efficiency of point-to-point, point-to-multipoint, multipoint-to-point, and multipoint-to-multipoint communications.

Embodiments of the invention may employ interference cancellation to provide superior performance compared to phased-array processing.

Embodiments of the invention may decompose a wideband signal characterized by inter-symbol interference in a multipath channel into a plurality of narrowband signals characterized by flat fading. Embodiments of the invention may provide improved channel compensation to wideband signals in a multipath environment.

Embodiments of the invention may decompose one or more wideband single-carrier signals into a plurality of narrowband signals adapted to be processed in a transmitter array and/or a receiver array.

Embodiments of the invention may optimally combine received frequency components of a single-carrier signal to reconstruct the single-carrier signal.

DESCRIPTION OF THE PREFERRED EMBODIMENTS

In the description of the preferred embodiments, it is assumed that the reader has a familiarity with electromagnetic cancellation, as described in U.S. Pat. Nos. 6,211,671, 6,208,135, and 5,523,526, which are all incorporated by reference.

Figure 1:
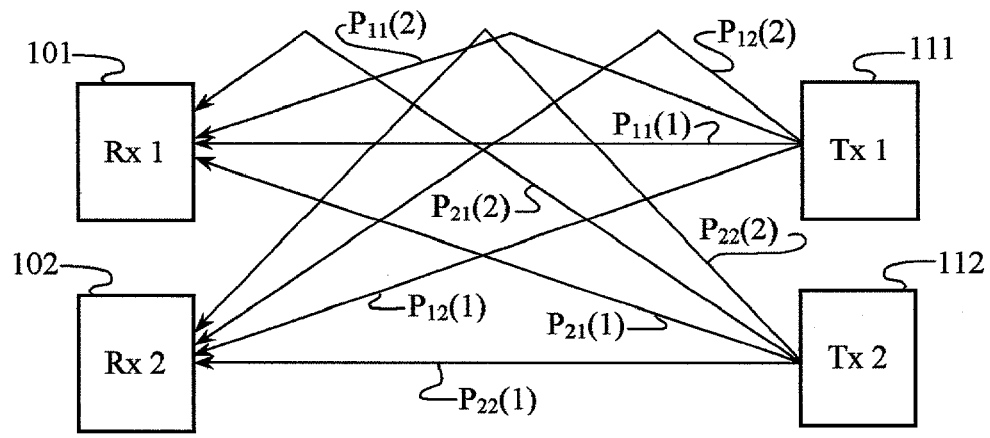
FIG. 1 illustrates an array of transmitters adapted to transmit a plurality of interfering signals received by an array of receivers. Cancellation circuits disclosed herein are adapted to separate one or more received signals from one or more interfering signals.

FIG. 1 illustrates a plurality of spatially separated receivers 101 and 102 adapted to be responsive to electromagnetic signals transmitted by a plurality of spatially separated transmitters 111 and 112. For the purpose of describing the function of a cancellation system, each receiver 101 and 102 is responsive to signals arriving along two transmission paths from the transmitters 111 and 112.

Transmitter 111 transmits a first signal $s_1(t)$ that arrives at receiver 101 from a line-of-sight transmission path $P_{11}(1)$ and a reflected (and thus, delayed) path $P_{11}(2)$. Similarly, transmitter 112 transmits a second signal $s_2(t)$ that arrives at receiver 101 from a line-of-sight transmission path $P_{21}(1)$ and a reflected (and thus, delayed) path $P_{21}(2)$. The signal $s_1(t)$ transmitted by transmitter 111 also arrives at receiver 102 via line-of-sight and reflected paths $P_{12}(1)$ and $P_{12}(2)$, respectively. Similarly, The signal $s_2(t)$ transmitted by transmitter 112 arrives at receiver 102 via line-of-sight and reflected paths $P_{22}(1)$ and $P_{22}(2)$, respectively. The receivers 101 and 102 receive different complex-valued proportions of the signals $s_1(t)$ and $s_2(t)$ due to differences in propagation (as described in the '671 patent), such as reflections and path loss.

A signal $r_1(t)$ received by receiver 101 can be expressed by:

$$r_1(t)=s_1(t)(\alpha_{11}(1)e^{i(2\pi ft+\theta_1)}+\alpha_{11}(2)e^{i(2\pi ft+2\pi\Delta d_{11}/\lambda+\theta_1)})+s_2(t)(\alpha_{21}(1)e^{i(2\pi ft+\theta_2)}+\alpha_{21}(2)e^{i(2\pi ft+2\pi\Delta d_{21}/\lambda+\theta_2)})$$

and a signal $r_2(t)$ receiver 102 can be expressed by:

$$r_2(t)=s_1(t)(\alpha_{12}(1)e^{i(2\pi ft+\theta_1)}+\alpha_{12}(2)e^{i(2\pi ft+2\pi\Delta d_{12}/\lambda+\theta_1)})+s_2(t)(\alpha_{22}(1)e^{i(2\pi ft+\theta_2)}+\alpha_{22}(2)e^{i(2\pi ft+2\pi\Delta d_{22}/\lambda+\theta_2)})$$

where terms $\alpha_{mn}(k)$ are path-loss variables indicating attenuation between an $m^{th}$ transmitter and an $n^{th}$ receiver corresponding to line-of-sight (k=1) and reflected (k=2) paths. The term f is frequency, which may characterize one or more frequency components of signals $s_1(t)$ and $s_2(t)$ and/or carrier or sub-carrier frequencies upon which signals $s_1(t)$ and $s_2(t)$ are modulated. The terms $\Delta d_{mn}$ indicate path-length differences between reflected and line-of-sight paths between an $m^{th}$ transmitter and an $n^{th}$ receiver. The term $\lambda$ indicates a signal wavelength, which is inversely proportional to the term(s) f. Phase terms $\theta_j$ are provided to indicate relative phases of the signals transmitted by the transmitters 111 and 112. The expressions for the received signals $r_1(t)$ and $r_2(t)$ may be rewritten as:

$$r_1(t)=[s_1(t)(\alpha_{11}(1)+\alpha_{11}(2)e^{i(2\pi\Delta d_{11}/\lambda+\theta_1)})e^{i\theta_1}+s_2(t)(\alpha_{21}(1)+\alpha_{21}(2)e^{i(2\pi\Delta d_{21}/\lambda)})e^{i\theta_2}]e^{i(2\pi ft)}$$

and $$r_2(t)=[s_1(t)(\alpha_{12}(1)+\alpha_{12}(2)e^{i(2\pi\Delta d_{12}/\lambda+\theta_1)})e^{i\theta_1}+s_2(t)(\alpha_{22}(1)+\alpha_{22}(2)e^{i(2\pi\Delta d_{22}/\lambda)})e^{i\theta_2}]e^{i(2\pi ft)}$$

The equations for $r_1(t)$ and $r_2(t)$ have the form:

$$r_n(t)=A_n e^{i\phi_n} e^{i(2\pi ft)}, n=1,2$$

where $A_n$ is a signal amplitude and $\phi_n$ is a signal phase.

$$A_1 = \sqrt{c_{11}^2 + c_{21}^2} \quad \phi_1 = \tan^{-1}(c_{11}/c_{21})$$

$$A_2 = \sqrt{c_{12}^2 + c_{22}^2} \quad \phi_1 = \tan^{-1}(c_{12}/c_{22})$$

The equations for $r_1(t)$ and $r_2(t)$ illustrate how both the amplitude $A_n$ and phase $\phi_n$ of each received signal $s_2(t)$, path-length distances $\Delta d_{mn}$, and path losses $\alpha_{mn}(k)$. These effects, which are described in the '671 patent, indicate why both amplitude and phase compensation are typically needed to compensate for propagation effects. The '671 also patent describes the placement of spatially separated transmitter and receiver elements to produce different propagation characteristics between transmitters and receiver such that interfering signals can be separated via cancellation.

The amplitude $A_n$ and phase $\phi_n$ of each received signal $r_1(t)$ and $r_2(t)$ also has frequency dependence. This is described in detail in the '671 patent as the reason that conventional cancellation systems do not effectively cancel broadband signals. The '671 patent describes frequency-dependent cancellation techniques (i.e., amplitude and phase adjustment followed by combining) to cancel signals having a broad range of frequencies, including multiple frequencies.

The cancellation methods described in the '671 patent process the received signals $r_1(t)$ and $r_2(t)$ as linear combinations of the interfering signals $s_1(t)$ and $s_2(t)$:

$$r_1(t)=a_{11}s_1(t)+a_{12}s_2(t)$$

$$r_2(t)=a_{21}s_1(t)+a_{22}s_2(t)$$

where the complex-valued terms $a_{nm}$ result from one or more frequency-dependent channel effects, such as path loss, multipath reflections, absorption, scattering, and dispersion. Algebraically unique proportions of the signals $s_1(t)$ and $s_2(t)$ in the received signals $r_1(t)$ and $r_2(t)$ are required in order to separate the interfering signals $s_1(t)$ and $s_2(t)$.

The cancellation methods described in the '671 patent provide complex weights (i.e., amplitude and/or phase adjustments) to the received signals $r_1(t)$ and $r_2(t)$ to mitigate the effects of interference on at least one desired signal due to at least one interfering signal, as illustrated by the following weighted and combined signals $r_1(t)$ and $r_2(t)$:

$$r_1(t)-(a_{11}/a_{21})r_2(t) \propto s_2(t)$$

$$r_2(t)-(a_{22}/a_{12})r_1(t) \propto s_1(t)$$

It is a trivial matter to determine the complex weights (e.g., ratios $a_{11}/a_{21}$ and $a_{22}/a_{12}$) if either or both signal values $s_1(t)$ and $s_2(t)$ are known or can accurately be determined. Methods for determining the complex weights may include deterministic and/or blind-adaptive techniques.

Known training symbols may be used to calibrate the weights. Unknown data symbols may be determined (such as with respect to known signal constellations, error correction, error detection, and/or some other confidence measurement) and used to adapt the weights. Once the weights are known, desired signals may be separated from interfering signals. Alternatively, the weights may be used in a performance-optimization process that adapts the weights to optimize one or more performance measurements, such as signal-to-noise ratio (SNR), signal-to-interference ratio (SIR), signal-to-noise-plus-interference ratio (SNIR), probability of error (P(E)), and bit-error rate (BER).

One aspect of the present invention provides for generating frequency-dependent weights to cancel signals having multiple frequencies. This aspect is described in both the '526 and '671 patents with respect to canceling multi-frequency electromagnetic signals generated by transducers of musical stringed instruments having a broad range of notes. This aspect is defined broadly in the '671 patent to cover all electromagnetic multi-frequency signals. Embodiments of the present invention use the same cancellation circuit specifically to cancel interference in multicarrier communication transmission protocols, such as OFDM, MC-CDMA, and CI protocols.

Figure 2:
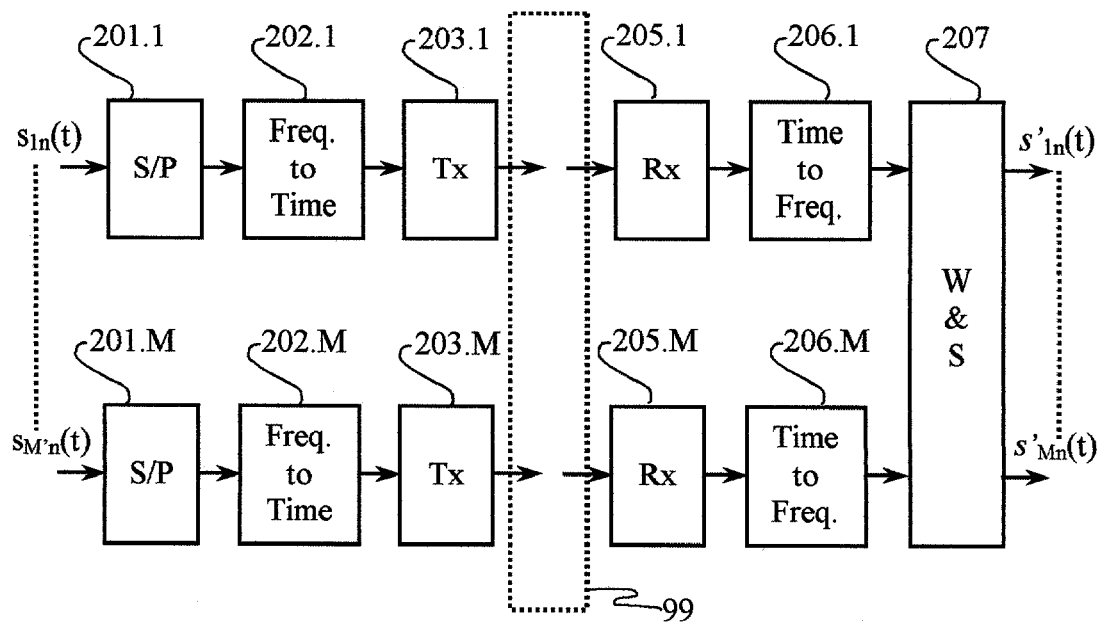
FIG. 2 illustrates a communication system adapted to transmit a plurality of interfering data symbols between a transmitter array and a receiver array. Frequency-dependent cancellation is employed to separate interfering signals at the receiver array.

FIG. 2 illustrates a communication system that is adapted to transmit a plurality of data symbols $s_{1n}(t)$ to $s_{Mn}(t)$ between a transmitter array 203.1 to 203.M and a receiver array 205.1 to 205.M. An $m^{th}$ (m=1, . . . ,M) set of data symbols $s_{mn}(t)$ is provided to an optional serial-to-parallel converter 201.$m$ coupled to a frequency-to-time converter 202.$m$. Each frequency-to-time converter 202.$m$ impresses the input symbols $s_{mn}(t)$ onto a plurality of sub-carrier frequencies $f_n$ (n=1, . . . ,N) that are transmitted into a communication channel 99 by the transmitter array 203.1 to 203.M.

Each serial-to-parallel converter 201.$m$ may be adapted to prepare a serial data stream $s_{mn}(t)$ for processing in a Fourier transform operation (e.g., an inverse fast Fourier transform) performed by the frequency-to-time converter 202.$m$. Alternatively, the frequency-to-time converter 202.$m$ may include other types of multicarrier modulation systems. The converter 202.$m$ may include digital filters, harmonic-signal generators, oscillators, and/or resonant feedback systems.

Each transmitter 203.$m$ is adapted to process the modulated sub-carriers for transmission into the communication channel. A radio transmitter typically performs amplification and frequency up-conversion. Furthermore, each transmitter (such as transmitters 203.1 to 203.M) may perform one or more additional operations, including, but not limited to, intermediate-frequency processing, filtering, mixing, modulation, beam forming, pre-distortion processing, crest-factor reduction, in-phase and quadrature-phase signal processing, signal formatting, channel selection, multiplexing, spread-spectrum processing, and multiple-access coding.

Each receiver element 205.$m$ is adapted to receive a plurality of transmitted communication signals from the channel 99. The received signals are processed in a plurality of time-to-frequency converters 206.1 to 206.M that convert the interfering data symbols in each sub-carrier band to baseband or intermediate-frequency symbols. The interfering symbols are separated from each other in a weight-and-sum circuit 207 (or any other appropriate cancellation circuit) adapted to output one or more desired-symbol estimates $s'_{1n}(t)$ to $s'_{Mn}(t)$.

The number of active receiver elements 205.1 to 205.M is preferably greater than or equal to the number of transmitter elements 203.1 to 203.M. In one embodiment of the inventions, the receiver elements 205.1 to 205.M can be positioned relatively close together such that the receiver array 205.1 to 205.M receives interfering transmit signals in at least one sub-carrier frequency band. The receiver elements 205.1 to 205.M may be substantially co-located.

Another embodiment of the invention may provide for the receiver elements 205.1 to 205.M being positioned in such a way (or otherwise adapted) to significantly vary the propagation characteristics between two or more transmitter elements 203.$m$ and two or more receiver elements 205.$m$. The receiver elements 205.1 to 205.M may be provided with different beam patterns, frequency-dependent gains, and/or element spacing.

Providing for different propagation characteristics between transmitter and receiver elements provides algebraically unique combinations of interfering symbols in the received signals. Similarly, transmitter characteristics (e.g., transmitter-element 203.$m$ spacing, beam directionality, weighting, etc.) may be used to adapt channel characteristics between transmitter elements 203.$m$ and receiver elements 205.$m$.

Each receiver element 205.$m$ is adapted to convert signals received from the channel 99 into a form that is appropriate for signal processing by baseband and/or intermediate-frequency processors within the receiver. Accordingly, the receiver elements 205.$m$ may include systems and/or subsystems adapted to perform one or more types of RF and/or digital processing, including, but not limited to, frequency down-conversion, mixing, filtering, amplification, channel selection, demodulation, demultiplexing, despreading, multiple-access, beam forming, decoding, and formatting.

The time-to-frequency converters 206.1 to 206.M process serial data streams to extract frequency-domain symbols. The converters 206.1 to 206.M may be implemented with Fourier transform operations (such as fast Fourier transforms). Alternatively, the converters 206.1 to 206.M may include other types of processors adapted to extract frequency-domain information from a serial data stream, including, but not limited to, filter banks, sample-and-add processors, correlators, integrators, matched filters, cascaded or tree filters, etc. The time-to-frequency converters 206.1 to 206.M are preferably adapted to select frequency bands with respect to channel conditions (e.g., coherence bandwidth), transmitted signal characteristics (e.g., sub-carrier frequencies), receiver limitations (clock speed, capability of processing parallel operations), and/or received data requirements (e.g., latency, BER, SNR).

The weight-and-sum processor 207 is coupled to the converters 206.1 to 206.M and adapted to cancel one or more interfering symbols in one or more desired data symbols. Thus, the array elements 205.1 to 205.M and their associated processors are connected to the weight-and-sum processor 207 via any type of network, which may include waveguide and/or wireless connections. The weight-and-sum processor 207 may perform any of various cancellation techniques, such as matrix reduction, matrix diagonalization, etc. Selection and/or adaptation of the weights may be performed to optimize one or more performance measurements of the desired data symbols.

The symbol estimates $s'_{1n}(t)$ to $s'_{Mn}(t)$ may be provided to one or more baseband processors (not shown) adapted to perform one or more signal-processing operations, such as channel decoding, error detection, error correction, channel estimation, signal-performance measurements, signal-performance analysis, combining, signal-value determination, etc.

Figure 3A:
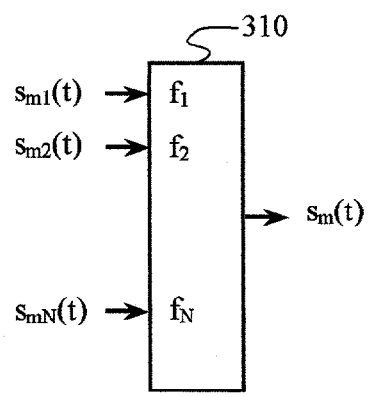
FIG. 3A illustrates the general function of a frequency-to-time converter.

FIG. 3A illustrates the general function of a frequency-to-time converter 310. A plurality of data symbols $s_{m1}(t)$ to $s_{mN}(t)$ are impressed onto a plurality of sub-carrier frequencies $f_1$ to $f_N$ that are combined to produce at least one time-domain signal $s_m(t)$. The data symbols $s_{m1}(t)$ to $s_{mN}(t)$ may be provided to input frequency bins of an inverse Fourier transform operation. Alternatively, the data symbols $s_{m1}(t)$ to $s_{mN}(t)$ may be modulated onto subcarriers generated by some other process.

Figure 3B:
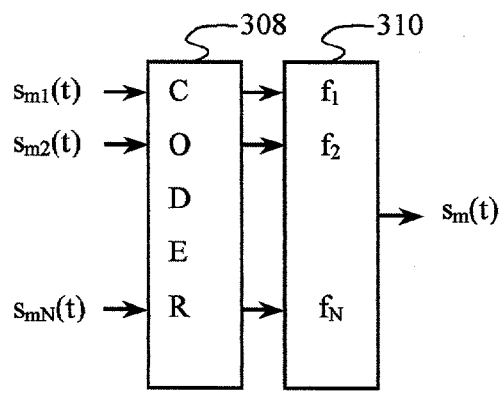
FIG. 3B illustrates the function of a coder and a frequency-to-time converter.

FIG. 3B illustrates the function of a coder 308 coupled to a frequency-to-time converter 310. A plurality of data symbols $s_{m1}(t)$ to $s_{mN}(t)$ are coded prior to being impressed onto a plurality of sub-carrier frequencies $f_1$ to $f_N$. The subcarriers are combined to produce at least one time-domain signal $s_m(t)$. The coder 308 is adapted to provide multiple-access coding, channel coding, spread-spectrum coding, encryption coding, and/or array-processing weights. Coding may be performed to provide coded-OFDM signals, MC-CDMA signals, spread-OFDM signals, or CI signals.

Figure 4A:
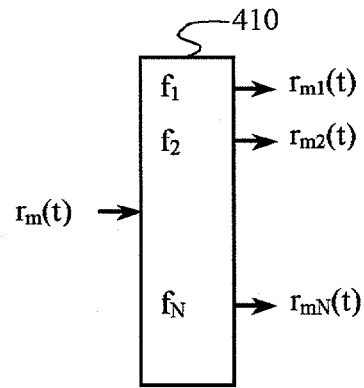
FIG. 4A illustrates the function of a time-to-frequency converter.

FIG. 4A illustrates the function of a time-to-frequency converter 410. A received signal $r_m(t)$ is separated into a plurality of sub-carrier frequencies $f_1$ to $f_N$ or values associated with each frequency $f_1$ to $f_N$. The converter 410 maybe implemented with a Fourier transform, a filter bank, cascaded filters, matched filters, correlators, integrators, and/or any other devices adapted to separate the received signal $r_m(t)$ into a plurality of frequency components. The received signal $r_m(t)$ may include a multicarrier signal, a continuous, wideband signal, and/or a multi-spectral signal (i.e., a signal distributed over multiple non-continuous frequency bands).

Figure 4B:
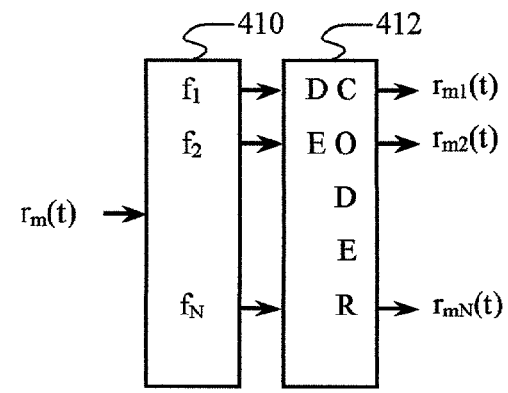
FIG. 4B illustrates the function of a system including a decoder coupled to a time-to-frequency converter.

FIG. 4B illustrates the function of a decoder 412 coupled to a time-to-frequency converter 410. Coded data symbols generated by the converter 410 are processed in the decoder 412. The decoder 412 provides an inverse (or complex conjugate) of the code provided on the transmit side associated with the received signal $r_m(t)$. The decoder 412 may compensate for channel effects, such as multipath, path loss, dispersion, absorption, scattering, shadowing, inductive noise, etc.

In some embodiments of the invention, the channel may provide coding in the sense that each user's unique propagation environment can be used to discriminate between different communication links. Channel coding can be provided by multipath effects that cause a delay spread in received signals, thus providing the means to mitigate the effects of impulse interference.

Figure 5A:
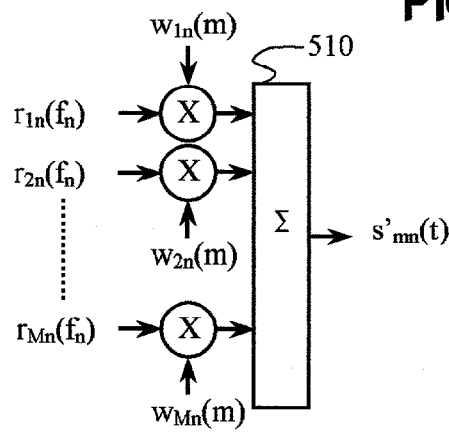
FIG. 5A illustrates a weight-and-sum circuit in accordance with an embodiment of the invention.

FIG. 5A illustrates a weight-and-sum circuit that can be used to cancel and/or separate interfering data symbols. A plurality M of received signals $r_{1n}(f_n)$ to $r_{Mn}(f_n)$ corresponding to an $n^{th}$ frequency $f_n$ are provided with a plurality M of complex weights $w_{1n}(m)$ to $w_{Mn}(m)$. The received signals $r_1(f_n)$ to $r_{Mn}(f_n)$ are considered to be algebraically unique linear combinations of data symbols $s_{mn}(f_n)$ impressed on frequency $f_n$. The weights $w_{1n}(m)$ to $w_{Mn}(m)$ are adapted to remove interference from at least an $m^{th}$ data signal $s_{mn}(f_n)$.

Figure 5B:
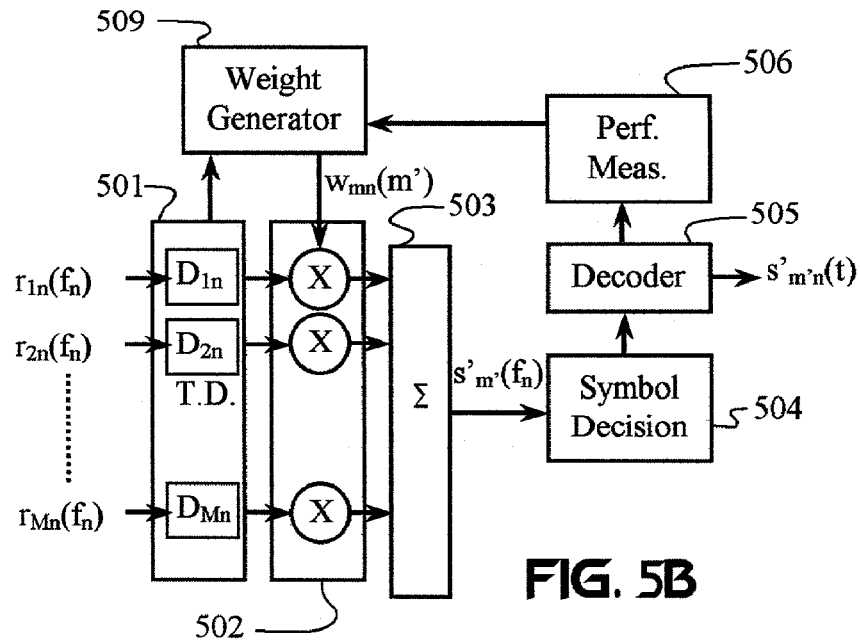
FIG. 5B illustrates another embodiment of a weight-and-sum circuit adapted to cancel and/or separate interfering data symbols.

FIG. 5B illustrates another embodiment of a weight-and-sum circuit adapted to cancel and/or separate interfering data symbols. A plurality M of received signals $r_{1n}(f_n)$ to $r_{Mn}(f_n)$ corresponding to an $n^{th}$ frequency $f_n$ are optionally analyzed by a threshold detector 501. Each received signal $r_{mn}(f_n)$ having frequency $f_n$ is provided by a different receiver output. M received signals $r_{mn}(f_n)$ are characterized by algebraically unique linear combinations of M'=M or fewer transmitted data symbols $s_{m'n}(f_n)$. Signals having magnitudes above a predetermined threshold (thus, experiencing jamming) and/or below a predetermined threshold (thus, having a low SNR) may be ignored (e.g., provided with a zero weight).

A weight generator 509 provides a plurality of weights $w_{mn}(m')$ adapted to mitigate interference for at least an $m'^{th}$ data symbol $s_{m'n}(f_n)$. The weights $w_{mn}(m')$ are impressed onto one or more received signals $r_{mn}(f_n)$ by a weight modulator 502. The weighted signals are summed in a combiner 503 to produce at least one value $s'_m(f_n)$ that is an estimate of at least one transmitted symbol $s_m(f_n)$ or is approximately proportional to the transmitted symbol $s_{m'}(f_n)$.

An optional symbol-decision system or algorithm 504, such as a quantizer, may provide a data-symbol estimate $s'_m(f_n)$. An optional decoder 505 may perform decoding as necessary. Decoding may include channel estimation.

A performance-measurement system or algorithm 506 controls the weight generator 509 to optimize cancellation. For example, cancellation weights $w_{mn}(m')$ may be selected and/or adjusted to optimize some performance measurement, such as probability of error, BER, SNR, SIR, SNIR, etc. The performance-measurement system 506 may compare data-symbol estimates with known transmitted data-symbol values. Variations in the processed symbols $s'_m(f_n)$ relative to known or estimated frequency-component (or data) symbols $s_m(f_n)$ may provide the basis for performance analysis. Weights $w_{mn}(m')$ may be selected and/or adjusted to reduce the variations. Similarly, channel estimates may be processed to determine weights that optimize performance.

In some cases, a transmitted data symbol $s_m(t)$ from an $m^{th}$ transmitter may be spread over multiple frequencies or over a wide frequency band. For example, coded OFDM, MC-CDMA, and some CI-based protocols code each data symbol $s_m(t)$ to generate multiple symbol values that are transmitted on different subcarriers. In DS-CDMA, as well as any other high-data-rate protocol, a data-symbol sequence $s_m(t)$ may be characterized by symbol components spread over a wide frequency band. Thus, symbol outputs $s'_{m'n}(t)$ corresponding to different frequencies $f_n$ may be combined in a wideband or multicarrier combiner (not shown). The combiner (not shown) may perform decoding, as necessary, and provide symbol estimates $s'_{m'n}(t)$ to the performance-measurement system 506.

Figure 6:
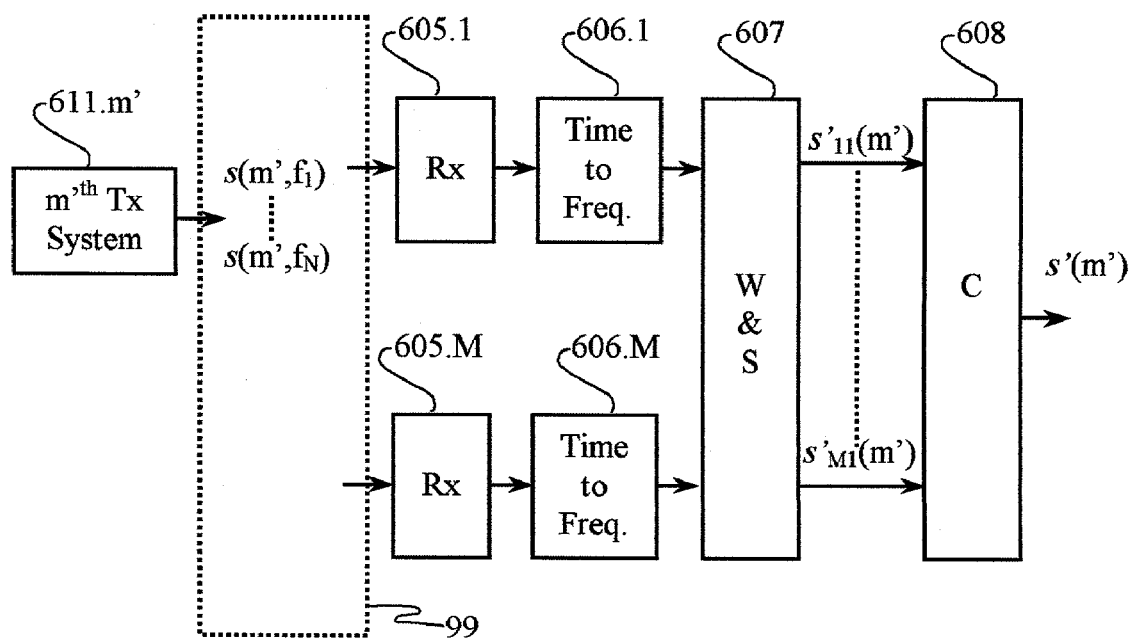
FIG. 6 illustrates a multi-element receiver adapted to separate a plurality of received interfering transmissions.

FIG. 6 illustrates a multi-element receiver adapted to separate a received transmission of at least an $m'^{th}$ transmission system 611.m' from at least one interfering signal. The $m'^{th}$ transmission system 611.m' generates a wideband signal $s(m', f_1 \leq f \leq f_N)$ or a multicarrier signal $s(m',f_1)$ to $s(m',f_N)$ characterized by one or more data symbols $s(m')$ spread over multiple carrier frequencies. For example, channel coding in coded OFDM places redundant data on multiple subcarriers.

The wideband $s(m', f_1 \leq f \leq f_N)$ or multicarrier signal $s(m', f_1)$ to $s(m',f_N)$ is received by a plurality M of receivers 605.1 to 605.M. Signals received by each receiver 605.1 to 605.M are decomposed into a plurality of sub-carrier frequencies $f_1$ to $f_N$ by a time-to-frequency converter 606.1 to 606.M, such as a filter bank. Signals corresponding to multiple frequencies are coupled into a weight-and-sum device 607. The weight-and-sum device 607 combines complex-weighted signals corresponding to each sub-carrier frequency band to separate interfering signals from the desired received sub-carrier components $s(m',f_1)$ to $s(m',f_N)$. The resulting sub-carrier components $s'_{11}(m')$ to $s'_{M1}(m')$ are combined in a combiner 608 to produce an estimate of the at least one transmitted data symbol $s(m')$.

The time-to-frequency converters 606.1 to 606.M produce sub-carrier frequencies $f_1$ to $f_N$ that may or may not correspond to sub-carrier frequencies of transmitted signals $s(m', f_1)$ to $s(m', f_N)$. In some cases, single-carrier signals may be decomposed into narrowband sub-carrier components prior to canceling at least one interfering signal from at least one desired signal. An advantage of processing signals in this manner is that the effects of multipath interference can be transformed from wideband interference to flat fading. This improves performance and simplifies receiver designs.

The combiner 608 may be adapted to decode one or more transmitted data symbols coded across a multicarrier signal. The combiner 608 may be adapted to provide weights to processed subcarrier signals $s'_{11}(m')$ to $s'_{M1}(m')$, such as to optimize some performance measurement of the resulting combined symbol estimate $s'(m')$. The combiner 608 may be adapted to perform optimal combining, such as MMSEC, EGC, MLC, or any combination thereof.

Figure 7A:
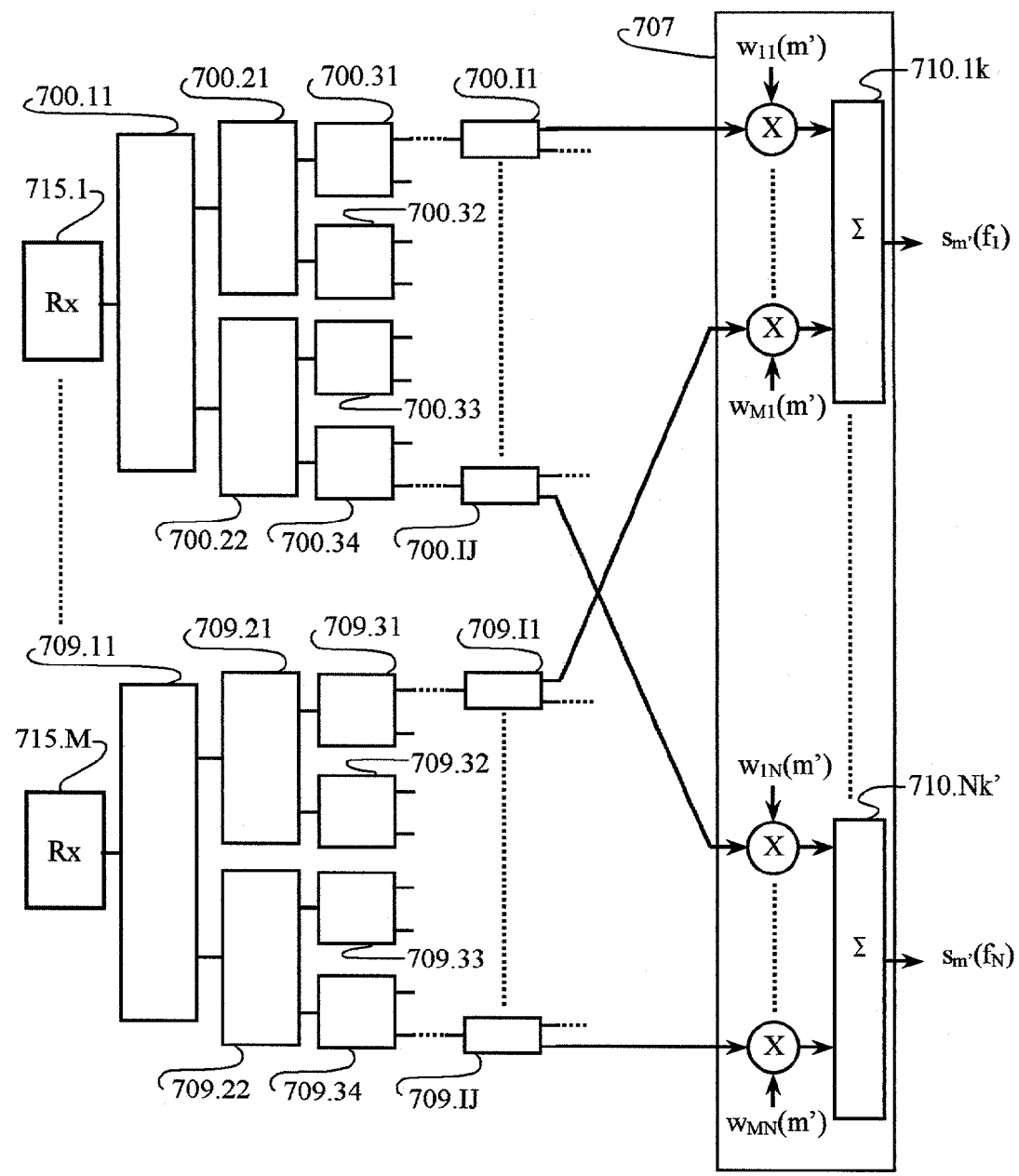
FIG. 7A illustrates a receiver adapted to separate a plurality of interfering received signals.

FIG. 7A illustrates a receiver adapted to separate a plurality of interfering received signals. A plurality M of receiver elements 715.1 to 715.M receive interfering data symbols transmitted by at least one remote transmitter (not shown). A filter tree constructed from a plurality of filter pairs, such as filter pairs 700.11 to 700.IJ and 709.11 to 709.IJ, decomposes received signals into a plurality N of frequency components $f_n$.

A weight-and-sum canceller 707 is adapted to weight and combine the frequency components $f_n$ from each filter tree to produce a plurality of output signals $s_m'(f_n)$. Each output signal $s_m'(f_n)$ corresponds to a unique frequency-transmitter combination (n,m'). Output signals $s_m'(f_n)$ corresponding to each transmitter (m') may be combined in an optimal combiner (not shown) coupled to the weight-and-sum canceller 707.

Figure 7B:
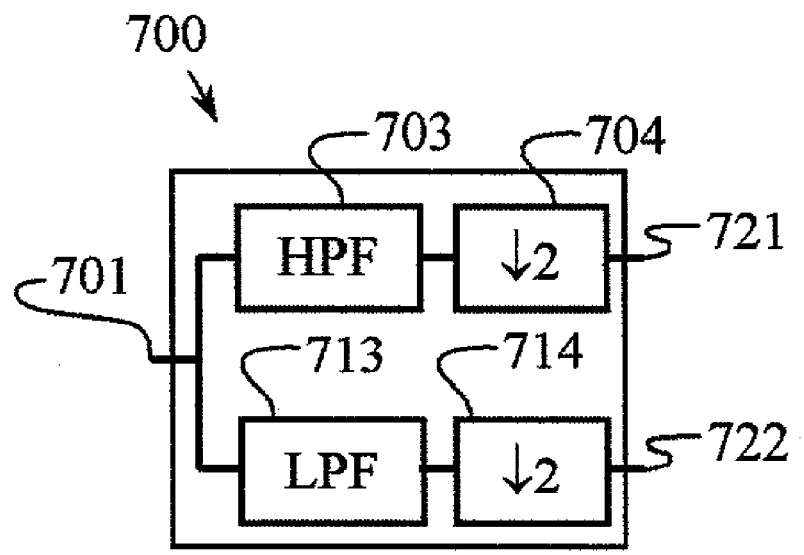
FIG. 7B illustrates basic components of a digital-filter pair adapted to decompose signals.

FIG. 7B illustrates basic components of a digital-filter pair 700 used to decompose signals. An input port 701 provides a data sequence to a high-pass filter 703 and a low-pass filter 713. Data streams output by the filters 703 and 713 are subsampled by a factor of two in a pair of subsamplers 704 and 714. Data streams output by the digital-filter pair 700 include high frequency and low frequency data streams. Various filter arrangements (not shown) may be provided with different numbers of filters.

Figure 7C:
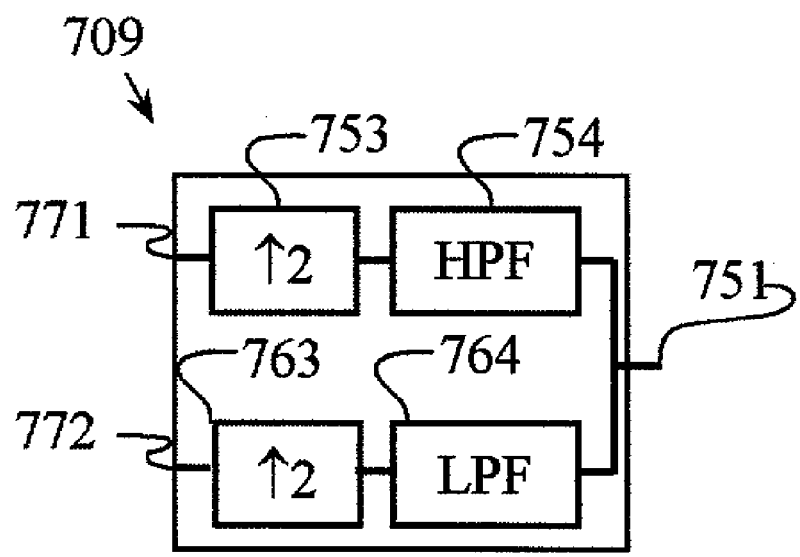
FIG. 7C illustrates basic components of a digital-filter pair adapted to synthesize signals.

FIG. 7C illustrates basic components of a digital-filter pair 709 adapted to synthesize signals. A pair of input ports 771 and 772 are coupled to a pair of up samplers 753 and 763. The up samplers 753 and 763 may add zeros to their input data streams at even and odd intervals, respectively. The up samplers 753 and 763 are coupled to a high-pass filter 754 and a low-pass filter 764, respectively. The outputs of the filters 754 and 764 are combined (i.e., summed such that the additional zeros in each stream do not coincide). The output of the combined signals has a bandwidth that is the sum of bandwidths of signals at the input ports 771 and 772.

Figure 7D:
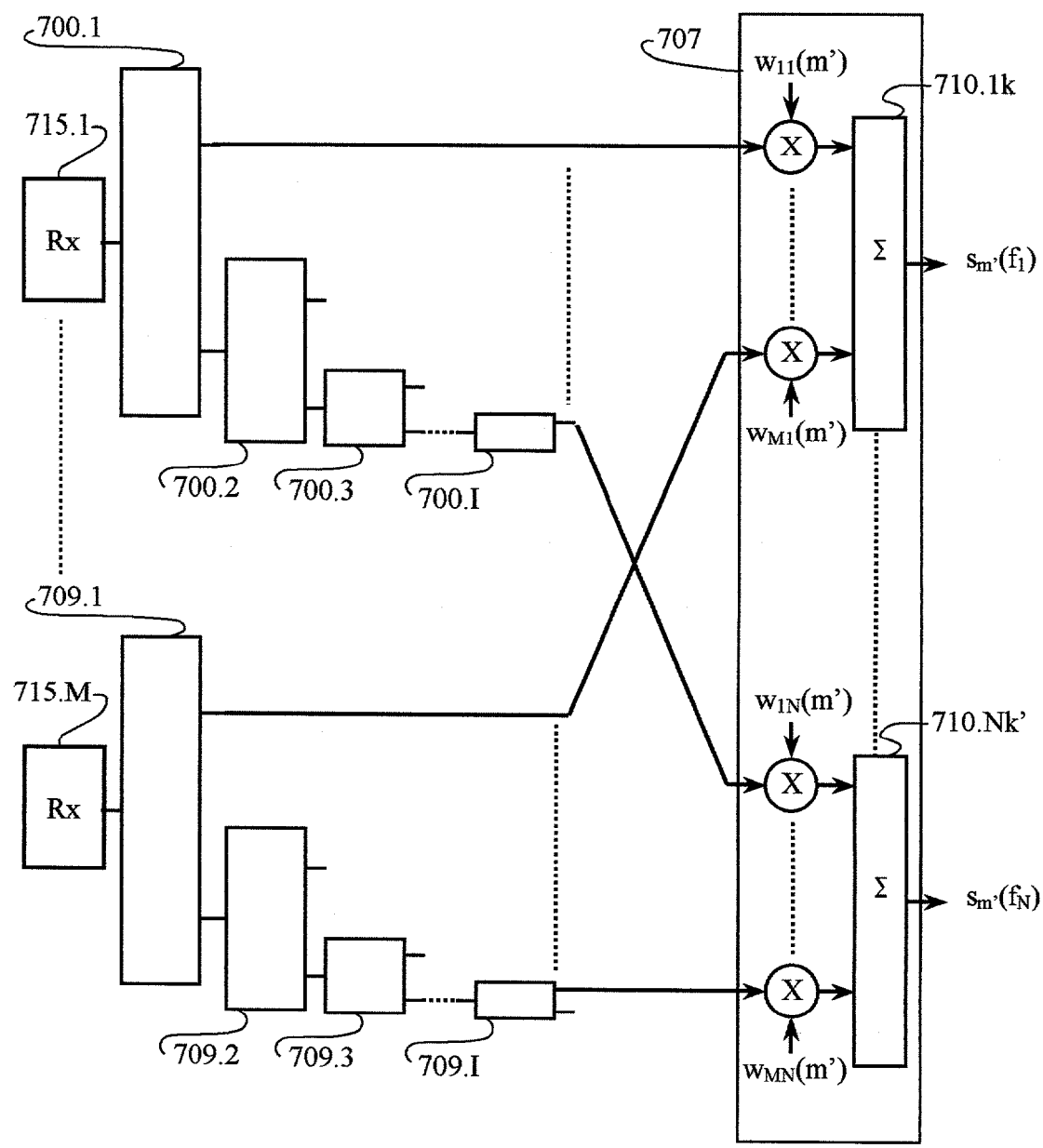
FIG. 7D illustrates a receiver adapted to separate a plurality of interfering received signals.

FIG. 7D illustrates a receiver adapted to separate a plurality of interfering received signals. A plurality M of receiver elements 715.1 to 715.M receive interfering data symbols transmitted by at least one remote transmitter (not shown). A filter tree constructed from a plurality of filter pairs, such as filter pairs 700.1 to 700.1 and 709.1 to 709.I, decomposes received signals into a plurality N of frequency components $f_1$ to $f_N$. In this case, the frequencies components have bandwidths that are related by powers of two. Alternatively, other non-uniform bandwidths may be selected.

A weight-and-sum canceller 707 is adapted to weight and combine the frequency components from each filter tree to produce a plurality of output signals $s_m'(f_n)$. Each output signal $s_m'(f_n)$ corresponds to a unique frequency-transmitter combination (n,m'). Output signals $s_m'(f_n)$ corresponding to each transmitter (m') may be combined in an optimal combiner (not shown) coupled to the weight-and-sum canceller 707.

Figure 8A:
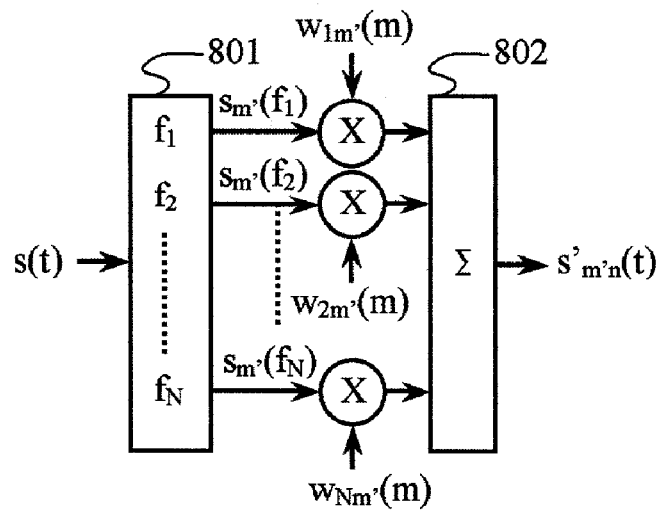
FIG. 8A illustrates a cancellation circuit that can be used with either or both transmission and reception operations.

FIG. 8A illustrates a cancellation circuit that can be used for either or both transmission and reception operations. A time-domain signal s(t), such as a signal including a sequence of data symbols $s_{m'}$, corresponding to an $m'^{th}$ receiver element (m'=1 to M'), is provided to a time-to-frequency converter 801 (e.g., a filter bank) to generate a plurality N of frequency-domain symbols $s_m(f_n)$. The symbols $s_m(f_n)$ may characterize frequency values and/or band-limited time-domain signals.

Complex-valued cancellation weights $w_{nm'}(m)$ related to at least an $m^{th}$ transceiver are applied to the symbols $s_m(f_n)$. The weights $w_{nm'}(m)$, which are frequency-dependent and receiver-dependent, are applied to each frequency component from each receiver element. Weighted symbols corresponding to different receivers for each frequency component $f_n$ are combined in a combiner 802 (e.g., an adder). The combined signals include a plurality of frequency components of a signal transmitted from the at least $m^{th}$ remote transmitter. The combined signals are combined again relative to each (e.g., $m^{th}$) remote transmitter.

In one embodiment of the invention, the weights $w_{nm'}(m)$ are adapted to remove interference from signals received from at least an $m^{th}$ remote transmitter. Interfering signals may be generated by one or more transmitters that are substantially co-located with the $m^{th}$ transmitter. The co-located transmitters may include a plurality of desired transmitters. Thus, weights corresponding to more than one transmitter may be provided to the symbols $s_m(f_n)$.

The process of decomposing the received signals into narrowband components allows one or more desired wideband signals to be separated from one or more interfering signals (including other desired signals) in a cancellation circuit. The method and systems embodiments of the invention can be exploited to deliberately transmit a plurality of interfering signals that can be separated in a receiver system. This allows substantial increases in bandwidth efficiency.

In another embodiment of the invention, the cancellation system shown in FIG. 8A may be used in a transmitter. A serial data stream s(t) is decomposed into a plurality of frequency components $s_m(f_n)$ that are weighted to compensate for channel distortion and/or provide for unique propagation channels. In a plurality of transmitter elements, each cancellation circuit is adapted to provide weights that generate a predetermined (constructive and/or destructive) interference pattern for each frequency component at one or more locations. Thus, the cancellation circuits may provide for signal cancellation at one or more spatial locations.

Figure 8B:
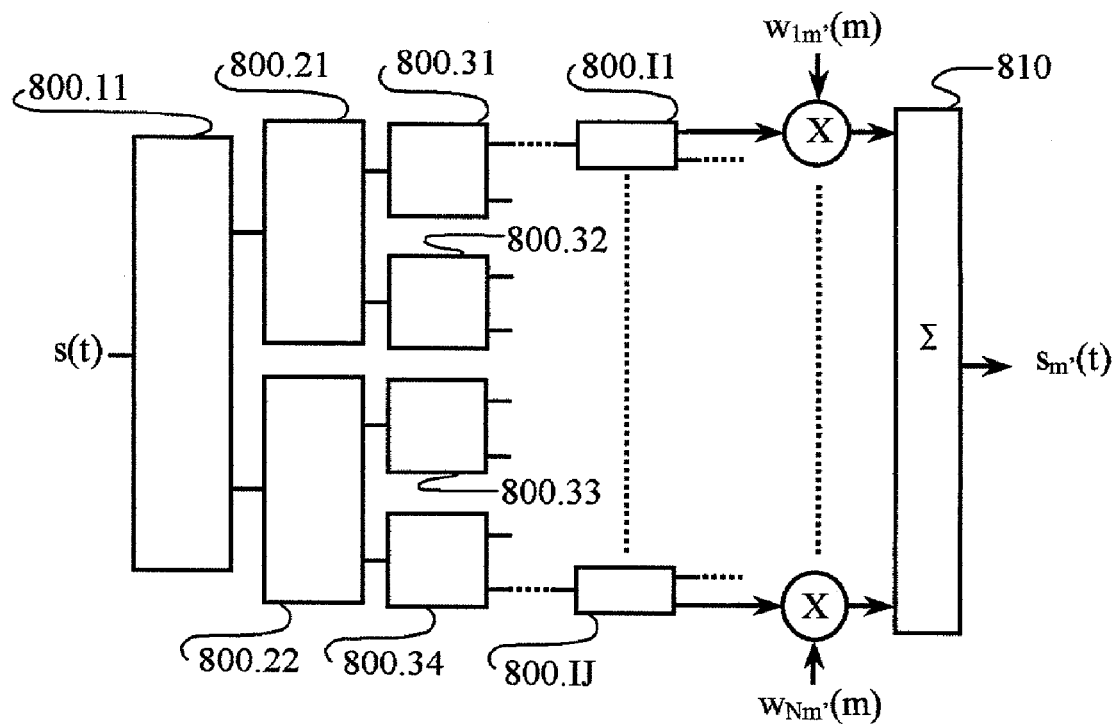
FIG. 8B illustrates a cancellation system that can be adapted to either or both receiver and transmitter operations.

FIG. 8B illustrates a cancellation circuit that can be adapted to either or both receiver and transmitter operations. A serial input s(t) is provided to a filter tree including a plurality of filter pairs 800.11 to 800.IJ. The resulting decomposed signals are provided with weights $w_{nm'}(m)$ corresponding to frequency number n, receiver number m', and transmitter number m. Weighted frequency components are combined in a combiner 810 with respect to one or more criteria, including similar frequencies fn, similar receiver numbers m', similar transmitter number m, or some combination thereof.

In one embodiment of the invention, the cancellation system shown in FIG. 8B is adapted to operate in a transmission system. In a plurality of transmitter elements, each of a plurality of cancellation systems (as shown in FIG. 8B) is adapted to generate weights $w_{nm'}(m)$ for each frequency component to compensate for channel effects and/or cancel one or more interfering signals in some predetermined region of space.

Figure 8C:
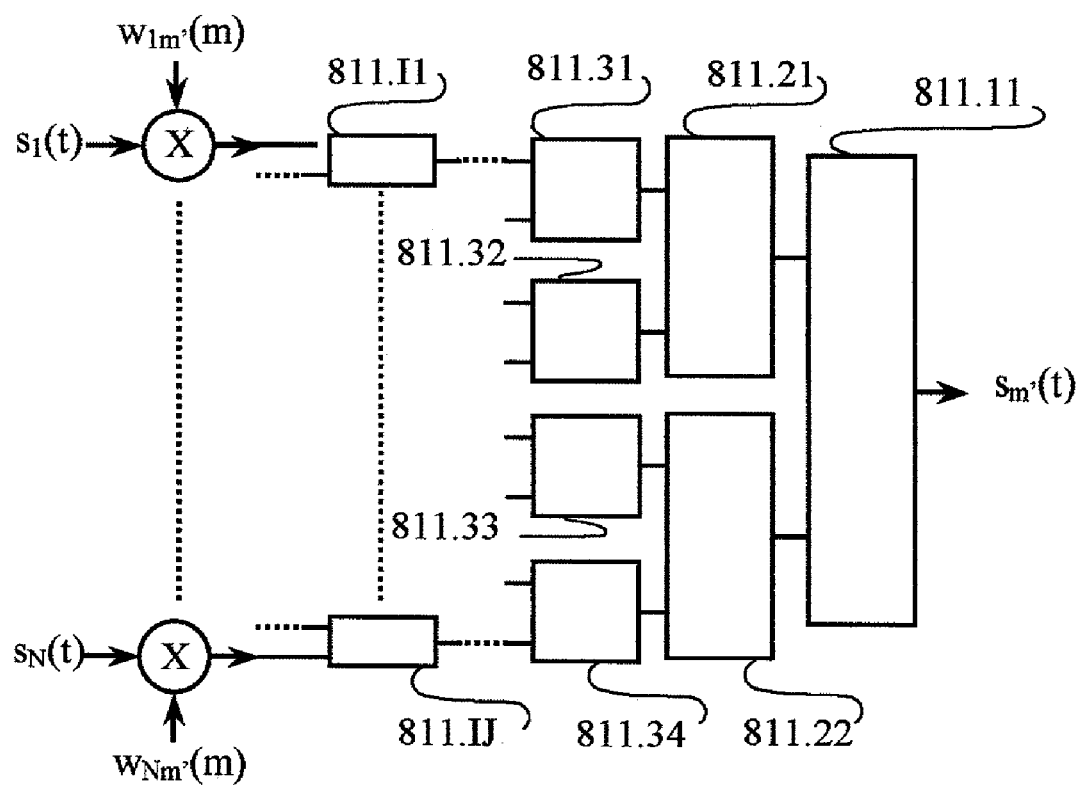
FIG. 8C illustrates an alterative embodiment of a cancellation system that can be adapted to either or both receiver and transmitter operations.

FIG. 8C illustrates an alterative embodiment of a cancellation circuit that can be adapted to either or both receiver and transmitter operations. In this case, the resulting frequency components have bandwidths that are related to each other by powers of two.

In the preferred embodiments, several types of cancellation circuits are illustrated to provide a basic understanding of transceiver-based cancellation, array processing, and wideband signal processing. With respect to this understanding, many aspects of this invention may vary.

For illustrative purposes, system diagrams and process flow diagrams represent the operation of embodiments of the invention. It should be understood, however, that the use of diagrams is for illustrative purposes only, and is not limiting. For example, the invention is not limited to the operational embodiment(s) represented by the system and process flow diagrams. The invention is not limited to specific signal and system architectures shown in the drawings. Instead, alternative operational embodiments and system architectures will be apparent to persons skilled in the relevant art(s) based on the discussion contained herein.

Alternate embodiments (equivalents, extensions, variations, deviations, combinations, etc.) of the methods and structural embodiments of the invention and the related art will be apparent to persons skilled in the relevant arts based on the teachings contained herein. The invention is intended to include such alternate embodiments. Such equivalents, extensions, variations, deviations, combinations, etc., are within the scope and spirit of the present invention.

Signal processing with respect to sinusoidal oscillating signals are described herein. Those skilled in the art will recognize there are other types of periodic oscillating signals that could be alternatively used, including, but not limited to sinc waveforms, square waves, triangle waves, and repetitive noise signals.

The foregoing discussion and the claims that follow describe the preferred embodiments of the present invention. With respect to the claims, it should be understood that changes can be made without departing from the essence of the invention. To the extent such changes embody the essence of the invention, each naturally falls within the breadth of protection encompassed by this patent. This is particularly true for the present invention because its basic concepts and understandings are fundamental in nature and can be broadly applied.

The invention claimed is:

1. An electromagnetic receiver system adapted to receive and separate at least one desired information signal from at least one interfering signal, the receiver system including:
   a plurality of electromagnetic receivers adapted to be responsive to electromagnetic signals including the at least one transmitted desired electromagnetic signal and the at least one transmitted interfering electromagnetic signal, the receivers being spatially separated to receive different proportions of the at least one transmitted desired electromagnetic signal and the at least one transmitted interfering electromagnetic signal, the receivers generating a plurality of received signals,
   a plurality of time-to-frequency converters wherein at least one of the converters is coupled to each of the receivers, each of the converters adapted to decompose the received signals into a plurality of frequency components, at least one of the frequency components produced by at least one of the converters including at least one desired signal frequency component and at least one interfering signal frequency component, and
   a frequency-dependent canceller coupled to the converters adapted to process the filtered received signals corresponding to the at least one frequency, the canceller adapted to provide at least one complex-valued weight to at least one frequency component generated by at least one of the converters to compensate for the different proportions of the at least one transmitted desired electromagnetic signal and the at least one transmitted interfering electromagnetic signal resulting from at least one of:
   a) differences in propagation of the electromagnetic signals to the plurality of electromagnetic receivers, and
   b) differences in the responsiveness of the electromagnetic receivers to the electromagnetic signals,
   the canceller adapted to combine the receive signals to separate at least one of the desired signal components by canceling at least one of the interfering signal components.

2. The electromagnetic receiver system recited in claim 1 wherein each of the receivers is adapted to down convert the received signals into baseband or intermediate-frequency signals.

3. The electromagnetic receiver system recited in claim 1 wherein a plurality of the receivers are provided with unique characteristics including one or more items of a set including beam patterns, frequency-dependent gain, and element spacing.

4. The electromagnetic receiver system recited in claim 1 wherein the converter includes at least one item of a set, including a Fourier transform, a filter tree, a plurality of filters having overlapping frequency profiles, and a plurality of filters having non-overlapping frequency profiles.

5. The electromagnetic receiver system recited in claim 1 wherein at least one of the converters is adapted to provide frequency components that are baseband values.

6. The electromagnetic receiver system recited in claim 1 wherein at least one of the converters is adapted to select the frequency components with respect to one or more signal parameters of a set including channel conditions, transmitted signal characteristics, receiver operating limitations, and received data requirements.

7. The electromagnetic receiver system recited in claim 1 wherein the canceller is adapted to provide weights relative to at least one optimal-combining process of a set including minimum mean squared error combining, equal gain combining, and maximum likelihood combining.

8. The electromagnetic receiver system recited in claim 1 wherein the canceller is adapted to optimize one or more performance measurements of a set including signal-to-noise ratio, signal-to-interference ratio, signal-to-noise-plus-interference ratio, probability of error, and bit-error rate.

9. An electromagnetic wave transmission system adapted to cancel at least one interfering electromagnetic signal in at least one predetermined region of space, the transmission system including:
   a plurality of transmitters, each transmitter adapted to transmit a multicarrier signal, the transmitters being spatially separated from each other, and
   a frequency-dependent weighting circuit coupled to the transmitters adapted to provide at least one complex weight to at least one frequency component of the multicarrier signal transmitted by each transmitter, each complex weight associated with each frequency of each multicarrier signal being selected to cancel a corresponding frequency component of the multicarrier signal in the at least one predetermined region of space, the weighting circuit adapted to compensate for amplitude differences and phase differences between the transmitted multicarrier signals resulting from propagation differences between the at least one transmitted cancellation signal and the at least one interfering signal to the predetermined region of space.

10. An electromagnetic-wave communication system adapted to transmit a plurality of data symbols from a transmitter system to a receiver system, the communication system including:
   a plurality of spatially separated transmitters adapted to transmit a plurality of data symbols in at least one common frequency band to produce a plurality of interfering transmitted data signals,
   a plurality of spatially separated receivers adapted to be responsive to the interfering transmitted data signals, each receiver adapted to generate a received signal including a plurality of received interfering data symbols,
   a plurality of time-to-frequency converters including at least one converter coupled to each of the receivers, each of the converters adapted to decompose the received signal generated by each receiver into a plurality of frequency components, and a frequency-dependent cancellation circuit, the cancellation circuit including:
  a weighting circuit coupled to the filter banks, the weighting circuit adapted to provide at least one complex weight to at least one of the frequency components of at least one of the received signals, the at least one weight being adapted to compensate for propagation differences between the received interfering data symbols, and
  a combining system coupled to at least one of the weighting circuit and the converters, the combining system adapted to combine common frequency components of each received signal to separate a plurality of the received interfering data symbols.

11. The electromagnetic-wave communication system recited in claim 10 wherein each of the transmitters is adapted to generate at least one of a set of signals including a multicarrier signal and a single-carrier signal.

12. The electromagnetic-wave communication system recited in claim 10 wherein each of the transmitters is adapted to transmit a unique data symbol.

13. The electromagnetic-wave communication system recited in claim 10 wherein each receiver is adapted to frequency convert the received signal into at least one of a set of signals including a baseband signal and an intermediate-frequency signal.

14. The electromagnetic communication system recited in claim 10 wherein at least one of the converters is adapted to select frequency components with respect to one or more signal parameters of a set including channel conditions, transmitted signal characteristics, receiver limitations, and received data requirements.

15. The electromagnetic communication system recited in claim 10 wherein the canceller is adapted to provide weights relative to at least one optimal-combining process of a set including minimum mean squared error combining, equal gain combining, and maximum likelihood combining.

16. The electromagnetic communication system recited in claim 10 wherein the canceller is adapted to optimize one or more performance measurements of a set including signal-to-noise ratio, signal-to-interference ratio, signal-to-noise-plus-interference ratio, probability of error, and bit-error rate.

17. The electromagnetic communication system recited in claim 10 wherein the converter includes at least one item of a set, including a Fourier transform, a filter tree, a matched filter, a plurality of filters having overlapping frequency profiles, and a plurality of filters having non-overlapping frequency profiles.

18. The electromagnetic communication system recited in claim 10 wherein the combining system is adapted to combine a plurality of different-frequency components.

19. A cancellation circuit adapted to be coupled to a plurality of receivers adapted to provide a plurality of algebraically unique proportions of a plurality of interfering received signals, the cancellation circuit including:
  a plurality of time-to-frequency converters adapted to be coupled to the receivers, each of the converters adapted to decompose at least one received signal into a plurality of frequency components, at least one of the frequency components including a plurality of interfering signal components,
  a weighting circuit coupled to the converters, the weighting circuit adapted to provide at least one frequency-dependent complex weight to at least one frequency component produced by at least one of the converters, the at least one weight being adapted to compensate for propagation differences between the plurality of interfering signal components that cause the algebraically unique proportions of the interfering received signals, and
  a combining system coupled to at least one of the weighting circuit and the plurality of converters, the combining system adapted to combine a plurality of common-frequency components of each received signal to separate the received interfering signals.

20. The cancellation circuit recited in claim 19 wherein at least one of the converters is adapted to select frequency components with respect to one or more signal parameters of a set including channel conditions, transmitted signal characteristics, receiver limitations, and received data requirements.

21. The cancellation circuit recited in claim 19 wherein the canceller is adapted to provide weights relative to at least one optimal-combining process of a set including minimum mean squared error combining, equal gain combining, and maximum likelihood combining.

22. The cancellation circuit recited in claim 19 wherein the canceller is adapted to optimize one or more performance measurements of a set including signal-to-noise ratio, signal-to-interference ratio, signal-to-noise-plus-interference ratio, probability of error, and bit-error rate.

23. The cancellation circuit recited in claim 19 wherein the converter includes at least one item of a set, including a Fourier transform, a filter tree, a matched filter, a plurality of filters having overlapping frequency profiles, and a plurality of filters having non-overlapping frequency profiles.

24. The cancellation circuit recited in claim 19 wherein the combining system is adapted to combine a plurality of the frequency components characterized by different frequencies.

* * * * *